United States Patent
Nii

(10) Patent No.: US 7,260,018 B2
(45) Date of Patent: Aug. 21, 2007

(54) MULTIPORT SEMICONDUCTOR MEMORY DEVICE

(75) Inventor: Koji Nii, Tokyo (JP)

(73) Assignee: Renesas Technology Corp., Tokyo (JP)

(*) Notice: Subject to any disclaimer, the term of this patent is extended or adjusted under 35 U.S.C. 154(b) by 103 days.

(21) Appl. No.: 11/250,407

(22) Filed: Oct. 17, 2005

(65) Prior Publication Data
US 2006/0092740 A1 May 4, 2006

(30) Foreign Application Priority Data
Oct. 29, 2004 (JP) ............................. 2004-316113

(51) Int. Cl.
*G11C 8/00* (2006.01)
*G11C 11/00* (2006.01)
(52) U.S. Cl. .................. 365/230.05; 365/154
(58) Field of Classification Search .......... 365/230.05, 365/154, 156
See application file for complete search history.

(56) References Cited

U.S. PATENT DOCUMENTS 6,044,034 A * 3/2000 Katakura ............... 365/230.05
6,711,086 B2 * 3/2004 Terada .................. 365/230.05
2004/0052147 A1 * 3/2004 McLaury ............... 365/230.05

FOREIGN PATENT DOCUMENTS

JP 07-141859 6/1995

OTHER PUBLICATIONS

Nii et al. "A 90 nm Dual-Port SRAM with 2.04 μ m² 8T-Thin Cell Using Dynamically-Controlled Column Bias Scheme." IEEE ISSC Digest of Technical Papers, 27.9 Feb. 2004.

* cited by examiner

*Primary Examiner*—Anh Phung
(74) *Attorney, Agent, or Firm*—McDermott Will & Emery LLP

(57) ABSTRACT

In the same row access, a voltage level of word lines WLA and WLB is set to a power supply voltage VDD−Vtp. On the other hand, in different rows access, a voltage level of word line WLA or WLB is set to power supply voltage VDD. Therefore, when both ports PA and PB simultaneously access the same row, the voltage level of word lines WLA, WLB is set to power supply voltage VDD−Vtp. Thus, a driving current amount of a memory cell is reduced, thereby preventing a reduction in a current ratio of a transistor. As a result, deterioration of SNM can be prevented.

2 Claims, 17 Drawing Sheets

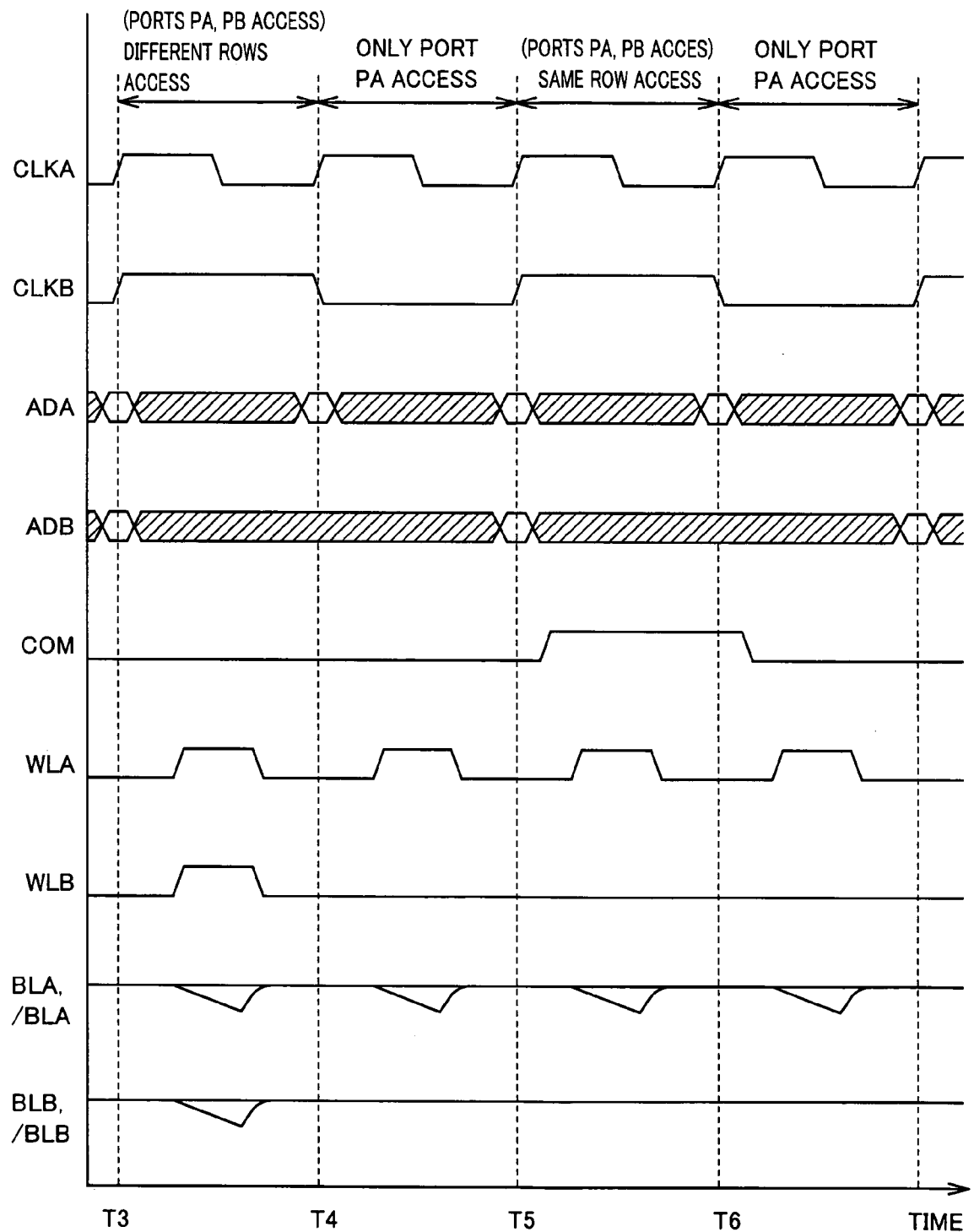

MULTIPORT SEMICONDUCTOR MEMORY DEVICE

BACKGROUND OF THE INVENTION

1. Field of the Invention

The present invention relates to a semiconductor memory device, and more particularly to an SRAM (Static Random Access Memory) having a multiport.

2. Description of the Background Art

Recently, digital signal processing for processing a large amount of data such as sounds and images at a high speed has been increasingly important with the widespread use of portable terminal equipment. SRAM allowing fast access processing plays an important role as a semiconductor memory device mounted on such portable terminal equipment.

On the other hand, a multiport semiconductor memory device receives attention, which uses each port to allow data reading and writing independently, and SRAM having a multiport has been in increasing demand.

In a dual-port that is a kind of multiport, data writing and reading can be executed simultaneously from two ports.

In the case of SRAM having such a dual-port, however, data writing may be executed on the same row simultaneously, for example. Particularly in this case, a high load may be applied to a memory cell, and thus an input of such a command is exceptionally prohibited in general.

In this respect, Japanese Patent Laying-Open No. 07-141859 discloses a technique for easily detecting simultaneous access to the same row.

However, in the simultaneous access to the same row, although simultaneous data writing on the same row is prohibited, simultaneous data reading can be executed without any trouble.

On the other hand, in designing SRAM memory cells, a static noise margin (also referred to as SNM hereafter) is generally known as a margin index for preventing destruction of data reading.

In an SRAM memory cell with a dual-port described above, two word lines are provided on the same row, where two word lines may simultaneously rise or only one of those word lines may rise. Therefore, it has been necessary to design a margin of an SRAM memory cell in view of SNM, in consideration of both cases.

In this respect, SNM is smaller when two word lines rise simultaneously than when only one word line rises.

Therefore, in order to improve SNM, the SRAM memory cell with a dual port is designed such that SNM is secured by increasing the size of a driver transistor of an N-channel MOS transistor forming an inverter, as compared with an access transistor electrically coupled to a word line on the same row.

Thus, as compared with an SRAM memory cell having a single port, a dual-port SRAM memory cell is disadvantageously increased in cell area as a whole since the number of transistors is increased by two and, in addition, the size of the driver transistor needs to be increased.

Moreover, the increased size of the driver transistor increases leak current during standby.

SUMMARY OF THE INVENTION

The present invention is made to solve the aforementioned problem. An object of the present invention is to provide a multiport semiconductor memory device in which a static noise margin (SNM) is adequately secured and in addition the memory cell size can be reduced.

A semiconductor memory device in accordance with the present invention includes: a memory array having a plurality of memory cells arranged in rows and columns; first and second ports receiving and transmitting input/output signals independent of each other; and a selection circuit capable of simultaneously accessing the memory array according to addresses respectively input to the first and second ports. The memory array includes a plurality of first and second word lines provided respectively corresponding to memory cell rows, and a plurality of first and second bit lines provided respectively corresponding to memory cell columns. Each memory cell includes a flip-flop circuit for setting first and second storage nodes to one and the other of first and second potential levels, respectively, according to data to be stored, a first gate transistor having its gate electrically coupled to a corresponding first word line for electrically coupling a corresponding first bit line to the flip-flop circuit, and a second gate transistor having its gate electrically coupled to a corresponding second word line for electrically coupling a corresponding second bit line to the flip-flop circuit. The selection circuit includes first and second row decoders provided respectively corresponding to the first and second ports for outputting respective row selection instructions according to input addresses, and a plurality of word drivers provided respectively corresponding to memory cell rows, each for driving corresponding first and second word lines according to row selection results from the first and second row decoders. When receiving an input of a row selection instruction from one of the first and second row decoders, each word driver sets a voltage level of a word line corresponding to the one to a first voltage level. When receiving inputs of row selection instructions from both of the first and second row decoders, each word driver sets respective voltage levels of first and second word lines to a second voltage level lower than the first voltage level.

A semiconductor memory device in accordance with the present invention sets respective voltage levels of first and second word lines to a second voltage level lower than a first voltage level when receiving inputs of row selection instructions from both of first and second row decoders. Therefore, even when two access transistors turn on, a driving current amount is reduced and a reduction in driving current ratio can be prevented. Deterioration in SNM can thus be prevented.

A semiconductor memory device in accordance with another aspect of the present invention includes: a memory array having a plurality of memory cells arranged in rows and columns; first and second ports receiving and transmitting input/output signals independent of each other; and a selection circuit capable of simultaneously accessing the memory array according to addresses respectively input to the first and second ports. The memory array includes a plurality of first and second word lines provided respectively corresponding to memory cell rows, and a plurality of first and second bit lines provided respectively corresponding to memory cell columns. Each memory cell includes a flip-flop circuit for setting first and second storage nodes to one and the other of first and second potential levels, respectively, according to data to be stored, a first gate transistor having its gate electrically coupled to a corresponding first word line for electrically coupling a corresponding first bit line to the flip-flop circuit, and a second gate transistor having its gate electrically coupled to a corresponding second word line for electrically coupling a corresponding second bit line to the flip-flop circuit. The semiconductor memory device further includes power supply lines provided respectively corresponding to memory cell rows, each supplying an operating voltage to the flip-flop circuit of each memory cell included in a corresponding memory cell row. The selection circuit includes first and second row decoders provided respectively corresponding to the first and second ports for outputting respective row selection instructions according to input addresses, and a plurality of word drivers provided respectively corresponding to memory cell rows, each driving corresponding first and second word lines according to row selection results from the first and second row decoders and also driving a corresponding power supply line. Each word driver sets a voltage level of a corresponding power supply line to a first voltage level when receiving an input of a row selection instruction from one of the first and second row decoders, and sets a voltage level of the corresponding power supply line to a second voltage level higher than the first voltage level when receiving inputs of row selection instructions from both of the first and second row decoders.

When inputs of row selection instructions are received from both of the first and second row decoders, the voltage level of the corresponding power supply line is set to the second voltage level higher than the first voltage level. The operating voltage of the flip-flop circuit is thereby increased. Therefore, even when two access transistors turn on, SNM can be secured sufficiently, thereby preventing deterioration in SNM.

A semiconductor memory device in accordance with a further aspect of the present invention includes: a memory array having a plurality of memory cells arranged in rows and columns; first and second ports receiving and transmitting input/output signals independent of each other; and a selection circuit capable of simultaneously accessing the memory array according to addresses respectively input to the first and second ports. The memory array includes a plurality of first and second word lines provided respectively corresponding to memory cell rows, and a plurality of first and second bit lines provided respectively corresponding to memory cell columns. Each memory cell includes a flip-flop circuit for setting first and second storage nodes to one and the other of first and second potential levels, respectively, according to data to be stored, a first gate transistor having its gate electrically coupled to a corresponding first word line for electrically coupling a corresponding first bit line to the flip-flop circuit, and a second gate transistor having its gate electrically coupled to a corresponding second word line for electrically coupling a corresponding second bit line to the flip-flop circuit. The selection circuit includes first and second row decoders provided respectively corresponding to the first and second ports for outputting respective row selection instructions according to input addresses, and a plurality of word drivers provided respectively corresponding to memory cell rows, each for driving corresponding first and second word lines according to row selection results from the first and second row decoders. When receiving an input of a row selection instruction from one of the first and second row decoders, each word driver drives a word line corresponding to the one. When receiving inputs of row selection instructions from both of the first and second row decoders, each word driver drives either one of the word lines.

When inputs of row selection instructions are received from both of the first and second row decoders, either one of the word lines is driven. Therefore, two access transistors do not turn on simultaneously, thereby reducing a driving current amount and preventing a reduction in driving current ratio. Therefore, deterioration in SNM can be prevented.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 21 is another timing chart where the same row access and different rows access are executed in synchronization with clock signals.

DESCRIPTION OF THE PREFERRED EMBODIMENTS

Figure 1:
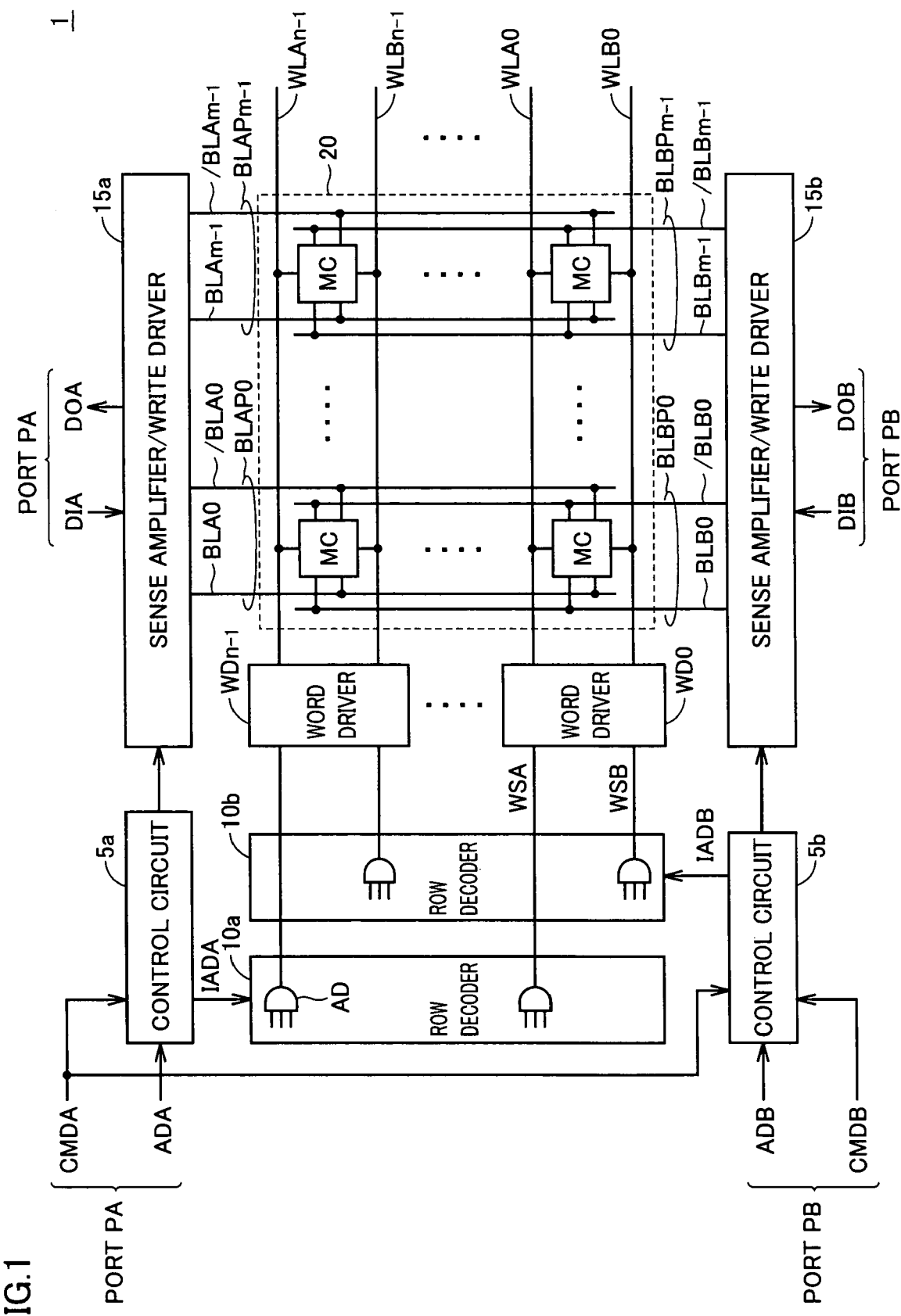
FIG. 1 is a schematic block diagram of a semiconductor memory device in accordance with a first embodiment of the present invention.

In the following, the embodiments of the present invention will be described in detail with reference to the figures. It is noted that in the figures the same or corresponding parts will be denoted with the same reference characters and description thereof will not be repeated.

First Embodiment

Referring to FIG. 1, a semiconductor memory device 1 in accordance with a first embodiment of the present invention includes a control circuit 5a for a port PA, a control circuit 5b for a port PB, a sense amplifier/write driver 15a for port PA, a sense amplifier/write driver 15b for port PB, a row decoder 10a for port PA, a row decoder 10b for port PB, a memory array 20, and word drivers WD0 to WDn−1.

Control circuit 5a outputs a buffered internal row address signal IADA to row decoder 10a based on an input of an address signal ADA input from port PA. Control circuit 5a further executes a necessary instruction or control for the other peripheral circuits to execute a prescribed operation based on a command signal CMDA input from port PA. In data reading, for example, control circuit 5a controls sense amplifier/write driver 15a, giving an instruction such that storage data read through a bit line is externally output as read data DOA. In data writing, control circuit 5a gives an instruction such that externally input write data DIA is written to a memory cell according to a selected address through a bit line.

Control circuit 5b, similar to control circuit 5a, outputs a buffered internal row address signal IADB to row decoder 10b based on an input of an address signal ADB input from port PB. Control circuit 5b further executes a necessary instruction or control for the other peripheral circuits to execute a prescribed operation based on a command signal CMDB input from port PB. In data reading, for example, control circuit 5b controls sense amplifier/write driver 15b, giving an instruction such that storage data read through a bit line is externally output as read data DOB. In data writing, control circuit 5b gives an instruction such that externally input write data DIB is written to a memory cell according to a selected address through a bit line. It is noted that, although not shown, control circuits 5a, 5b execute a series of processes based on inputs of an address signal and a command signal in synchronization with a clock signal. It is noted that control circuit 5b receives command CMDA input to control circuit 5a. When both control circuits 5a and 5b select a write command, the write command is not executed in control circuit 5b. In other cases, in operation, a write command and a read command may be executed using both ports. This example will be described below assuming that commands CMD input to control circuits 5a and 5b are both read commands for the sake of simplicity.

Row decoder 10a outputs a decode signal as a row selection result to word drivers WD0 to WDn−1 (hereinafter also referred to as word driver WD collectively) based on an input of the buffered internal row address signal IADA from control circuit 5a. Similarly, row decoder 10b outputs a decode signal as a row selection result to word drivers WD0 to WDn−1 based on an input of the buffered internal row address signal IADB from control circuit 5b. Row decoder 10a consists of a plurality of logic circuits AD. In the present example, it is assumed that a decode signal of "H" level is output to a corresponding word driver WD based on one of combinations of input internal row address signals.

A memory array 20 has a plurality of memory cells MC that are integrally arranged in rows and columns.

Memory array 20 has a plurality of word lines WLA, WLB for port PA and port PB provided corresponding to respective memory cell rows.

In the present example, n memory cell rows are arranged, and word lines WLA0, WLB0 and WLAn−1, WLBn−1 are shown corresponding to the first and the n-th memory cell rows, respectively, by way of example.

In addition, bit line pairs BLAP and BLBP for ports PA and PB are provided corresponding to respective memory cell columns.

In the present example, m memory cell columns are arranged, and bit line pairs BLAP0, BLBP0 and BLAPm−1, BLBPm−1 are shown corresponding to the first and the m-th memory cell columns, respectively, by way of example.

Each bit line pair has two bit lines complementary to each other. Bit line pair BLAP0 includes bit lines BLA0 and /BLA0 (hereinafter also referred to as bit lines BLA, /BLA collectively). Similarly, bit line pair BLBP0 includes bit lines BLB0, /BLB0 (hereinafter also referred to as bit lines BLB, /BLB collectively).

Word drivers WD are provided corresponding to respective memory cell rows to selectively activate the corresponding word line WLA or WLB based on the decode signal output from row decoders 10a, 10b.

In reading data, sense amplifier/write drivers 15a, 15b amplify data transmitted to bit line pair BLPA or BLPB to output the data as read data DOA, DOB in response to instructions from control circuits 5a, 5b. On the other hand, in data writing, sense amplifier/write drivers 15a, 15b transmit a voltage level according to write data DIA, DIB to bit line pair BLPA or BLPB.

Figure 2:
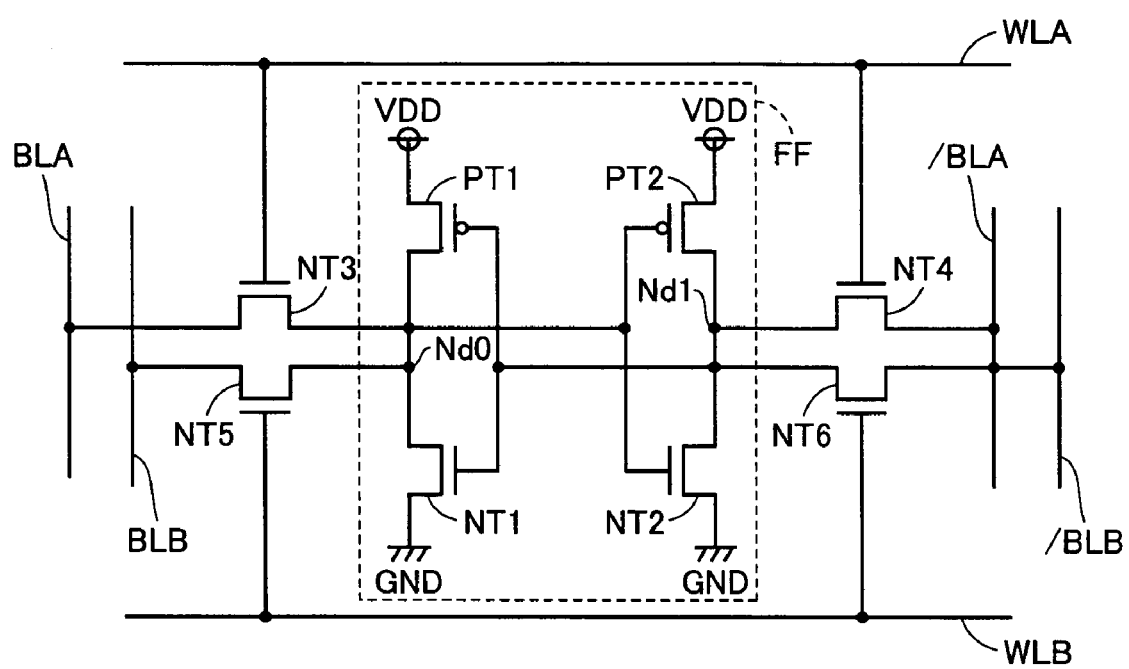
FIG. 2 is a diagram illustrating a configuration of a memory cell in accordance with the first embodiment of the present invention.

Referring to FIG. 2, memory cell MC in accordance with the first embodiment of the present invention includes transistors PT1, PT2, and NT1 to NT6. It is noted that transistors PT1, PT2 are P-channel MOS transistors by way of example. Furthermore, transistors NT3 to NT6 are N-channel MOS transistors by way of example. Here, transistors NT3 to NT6 are access transistors each provided between a bit line and a storage node. Transistors NT1, NT2, PT1, PT2 are driver transistors constituting an inverter in memory cell MC.

Transistor PT1 is arranged between a power supply voltage VDD and a storage node Nd0 and has its gate electrically coupled to a storage node Nd1. Transistor NT1 is arranged between storage node Nd0 and a ground voltage GND and has its gate electrically coupled to storage node Nd1. Transistor PT2 is arranged between power supply voltage VDD and storage node Nd1 and has its gate electrically coupled to storage node Nd0. Transistor NT2 is arranged between storage node Nd1 and ground voltage GND and has its gate electrically coupled to storage node Nd0. These transistors PT1, PT2 and NT1, NT2 form two CMOS inverters for holding the signal level at storage nodes Nd0 and Nd1 and are cross-coupled to form a CMOS type flip-flop circuit.

Access transistor NT3 is arranged between storage node Nd0 and bit line BLA and has its gate electrically coupled to word line WLA. Access transistor NT4 is arranged between storage node Nd1 and bit line /BLA and has its gate electrically coupled to word line WLA. Access transistor NT5 is arranged between storage node Nd0 and bit line BLB and has its gate electrically coupled to word line WLB. Access transistor NT6 is arrange between storage node Nd1 and bit line /BLB and has its gate electrically coupled to WLB.

Data writing and reading for storage node Nd0 and storage node Nd1 is carried out by turning on access transistor NT3 and access transistor NT4 or turning on access transistors NT5 and NT6 in response to activation (H level) of word line WLA or word line WLB to cause storage nodes Nd0 and Nd1 to be electrically coupled to bit lines BLA and /BLA or bit lines BLB and /BLB, respectively.

For example, when word line WLA is inactivated (L level) to turn off access transistors NT3 and NT4, one of N-type and P-type MOS transistors turns on in the respective CMOS inverters according to the data level held at storage nodes Nd0 and Nd1. Accordingly, according to the data level held in the memory cell, storage nodes Nd0 and Nd1 are coupled respectively to one and the other of power supply voltage VCC corresponding to "H" level of data and ground voltage GND corresponding to "L" level of data. It is therefore possible to hold data in a memory cell during a standby state without performing a refresh operation by periodically turning on word line WLA. Word line WLB is similar to word line WLA and therefore the detailed description will not be repeated.

Figure 3:
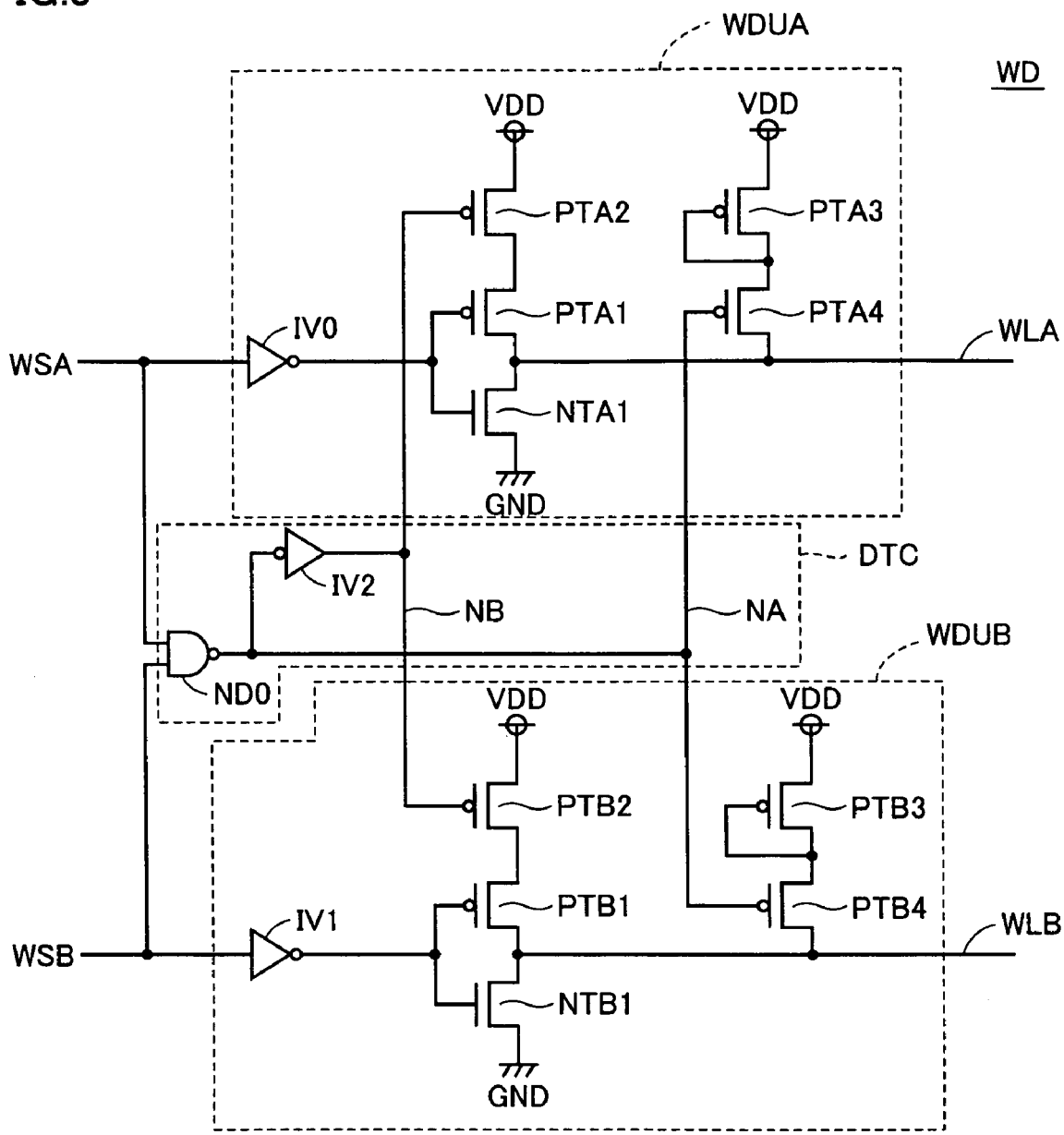
FIG. 3 is a circuit configuration diagram of a word driver in accordance with the first embodiment of the present invention.

Referring to FIG. 3, word driver WD in accordance with the first embodiment of the present invention includes transistors NTA1, PTA1 to PTA4, transistors NTB1, PTB1 to PTB4, inverters IV0 to IV2, and an NAND circuit ND0. It is noted that transistors NTA1, NTB1 are N-channel MOS transistors. Transistors PTA1 to PTA4, PTB1 to PTB4 are P-channel MOS transistors.

Transistors PTA3, PTA4 are arranged between power supply voltage VDD and word line WLA. The gate of transistor PTA3 is diode-connected to be electrically coupled to the source side of transistor PTA4. The gate of transistor PTA4 is electrically coupled to node NA. Transistors PTA2, PTA1 and transistor NTA1 are connected in series between power supply voltage VDD and ground voltage GND. The gate of transistor PTA2 is electrically coupled to node NB. A connection node between transistor PTA1 and transistor NTA1 is electrically coupled to word line WLA. The gates of transistor PTA1, NTA1 receive respective inputs of an inversion signal of a decode signal WSA through inverter IV0. It is noted that transistors PTA1 to PTA4, NTA1 and inverter IV0 constitute a word driver unit WDUA for driving word line WLA.

Transistors PTB3, PTB4 are arranged between power supply voltage VDD and word line WLB. The gate of transistor PTB3 is diode-connected to be electrically coupled to the source side of transistor PTB4. The gate of transistor PTB4 is electrically coupled to a node NA. Transistors PTB2, PTB1 and transistor NTB1 are connected in series between power supply voltage VDD and ground voltage GND. The gate of transistor PTB2 is electrically coupled to a node NB. A connection node between transistors PTB1 and NTB1 is electrically coupled to word line WLB. The gates of transistors PTB1, NTB1 receive respective inputs of an inversion signal of a decode signal WSB through inverter IV1. It is noted that transistors PTB1 to PTB4, NTB1 and inverter IV1 constitute a word driver unit WDUB for driving word line WLB.

NAND circuit ND0 receives inputs of decode signal WSA and decode signal WSB to transmit its NAND logic operation result to node NA. Inverter IV2 receives an output signal from NAND circuit ND0 to transmit its inversion signal to node NB. It is noted that NAND circuit ND0 and inverter IV2 constitute a detection circuit DTC for detecting whether the same row address is selected.

In the following, the operation of word driver WD in accordance with the first embodiment of the present invention will be described.

Decode signals WSA, WSB are set to "L" level in a normal inactivated state and to "H" level in an activated state.

For example, it is assumed that decode signal WSA is selected and activated based on address signal ADA of port PA. In this situation, decode signal WSB of port PB is in the inactivated state. In other words, row addresses different from each other are selected in ports PA and PB (hereinafter simply referred to as different rows access). Specifically, it is assumed that decode signals WSA, WSB are at "H" level and "L" level, respectively.

In this case, in detection circuit DTC, since both of decode signals WSA, WSB are not at "H" level, that is, the same row address is not selected, an output signal that is an NAND output result from NAND circuit ND0 is set to "H" level. Then, the inversion signal thereof is set to "L" level. In other words, the voltage level of nodes NA, NB are "H" level and "L" level.

Therefore, in word driver unit WDUA, transistors PTA2 and PTA1 turn on and transistor NTA1 is kept off. Accordingly, word line WLA changes from "L" level as the initial state to "H" level so that word line WLA is activated. It is noted that when decode signal WSA is at "L" level, word line WLA is set to "L" level since transistor NTA is kept on.

Here, transistor PT4 is kept off since node NA is at "H" level.

Then, when decode signal WSA goes to "L" level, transistors PTA2, PTA1 turn off, and thus word line WLA enters an inactivated state ("L" level) as the initial state.

Similarly, when row select signal WSB for port PB goes to "H" level, word line WLB is activated to "H" level in word driver unit WDUB, as described above in word driver unit WDUA.

In short, as described above, when row addresses different from each other in ports PA and PB are selected, the voltage level of one of word lines WLA, WLB is driven to "H" level (voltage VDD level).

Now, it will be considered that a row address of the same row is selected simultaneously in ports PA, PB (hereinafter simply referred to as the same row access). In this case, both of decode signals WSA and WSB go to "H" level. Accordingly, the output signal of NAND circuit ND0 is set to "L" level. Then, the inversion signal thereof is set to "H" level. In other words, the voltage levels at nodes NA and NB are "L" level and "H" level.

Therefore, transistors PTA2, PTB2 turn off. On the other hand, transistors PTA4, PTB4 turn on. Therefore, word line WLA is not driven by the voltage level of power supply voltage VDD through transistors PTA1 and PTA2 but is driven by power supply voltage VDD–Vtp through transistors PTA3, PTA4 where the voltage drops from power supply voltage VDD by threshold voltage Vtp of transistor PTA3 as diode-connected. Similar to word line WLA, word line WLB is not driven by the voltage level of power supply voltage VDD through transistors PTB1 and PTB2 but is driven by power supply voltage VDD−Vtp through transistors PTB3, PTB4 where the voltage drops from power supply voltage VDD by threshold voltage Vtp of transistor PTB3 as diode-connected.

For example, assuming that power supply voltage VDD is 1.2V and threshold voltage Vtp of transistors PTA3, PTB3 is 0.4V, when ports PA, PB select the row address of the same row, word lines WLA, WLB are driven by 1.2−0.4=0.8V Referring to FIG. 4, a voltage level of a word line in the same row access and in different rows access will be described.

Figure 4:
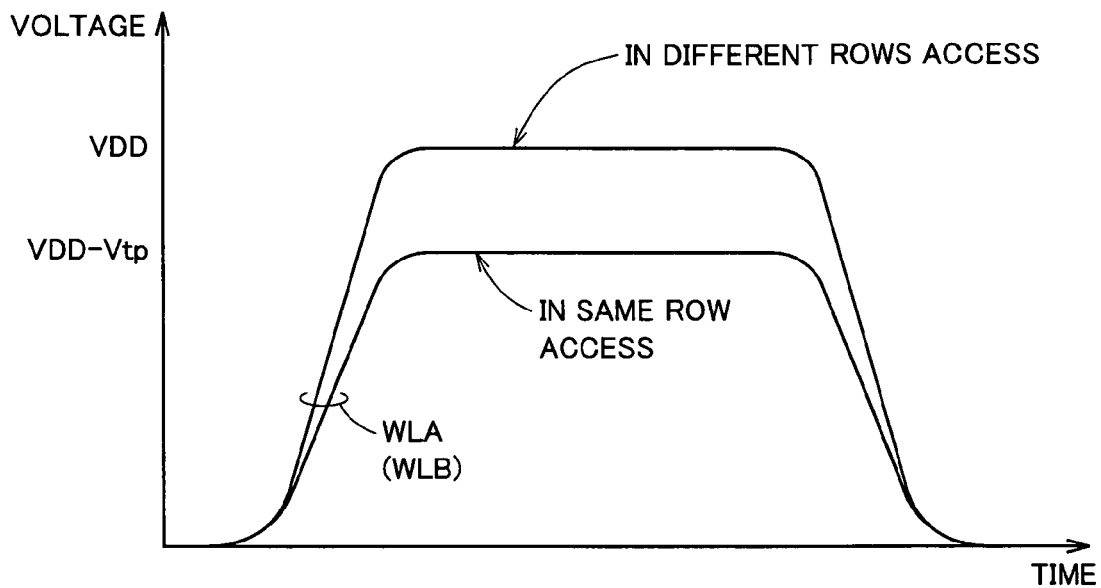
FIG. 4 is a diagram illustrating a voltage level of a word line in the same row access and in different rows access.

As shown in FIG. 4, in the same row access, the voltage level of word lines WLA and WLB is set at power supply voltage VDD−Vtp. On the other hand, in the different rows access, the voltage level of word line WLA or WLB is set at power supply voltage VDD.

Figure 5:
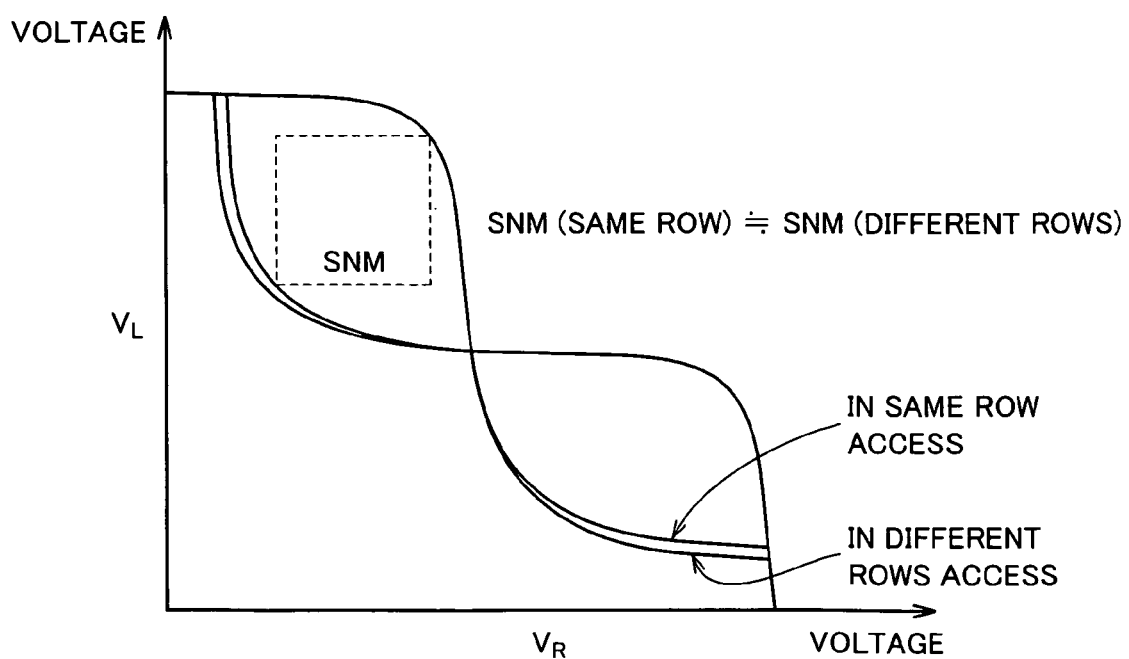
FIG. 5 is a diagram illustrating a static noise margin in a memory cell in accordance with the first embodiment of the present invention.

Referring to FIG. 5, a static noise margin in a memory cell in accordance with the first embodiment of the present invention will be described.

As shown in FIG. 5, in the present example, in the same row access, the voltage level of word lines WLA and WLB is decreased from power supply voltage VDD to power supply voltage VDD−Vtp, thereby preventing deterioration of SNM.

The reason for this will be explained. In the access from only one port, for example, when the voltage level of word line WLA is set to power supply voltage VDD and the voltage level of word line WLB is set to ground voltage GND (0V), the ratio between the driving current of transistor NT1 and the combined driving current of transistors NT3 and NT5 is 1. On the other hand, the ratio between the driving current of transistor NT2 and the combined driving current of transistors NT4 and NT6 is 1.

On the other hand, when ports PA, PB simultaneously access the same row, the ratio between the driving current of transistor NT1 and the combined driving current of transistors NT3 and NT5 is smaller than 1 where the voltage level of word lines WLA, WLB is power supply voltage VDD. On the other hand, the ratio between the driving current of transistor NT2 and the combined driving current of transistors NT4 and NT6 is smaller than 1.

Figure 6:
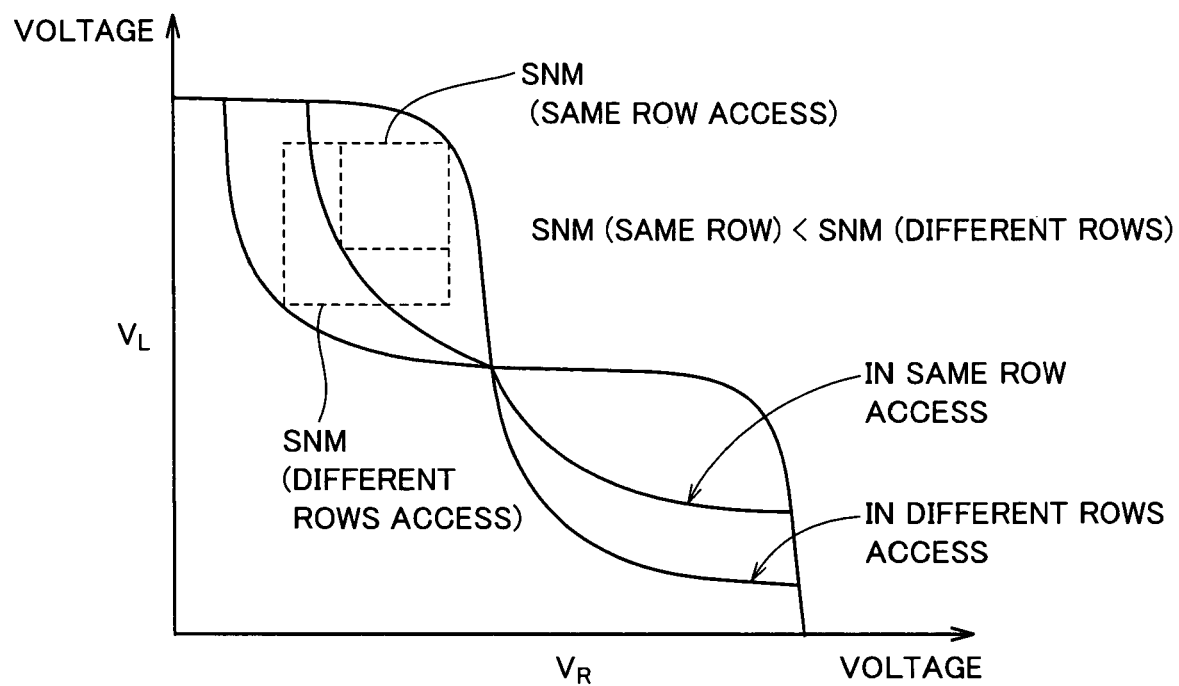
FIG. 6 is a diagram illustrating deterioration of SNM when ports simultaneously access to the same row.

Therefore, when ports PA, PB simultaneously access the same row, SNM is decreased as compared with the different rows access, as shown in FIG. 6, where the voltage level of word lines WLA, WLB is power supply voltage VDD.

In the present embodiment, when ports PA, PB simultaneously access the same row, the voltage level of word lines WLA, WLB is set at power supply voltage VDD−Vtp. The driving current of the access transistor is thus reduced, thereby preventing a reduction of the driving current ratio. As a result, deterioration of SNM can be prevented.

As in the configuration of the first embodiment, a reduction in a static noise margin can be prevented by dynamically controlling a voltage level of a word line. Therefore, it is not necessary to increase the size of a driver transistor and it is possible to reduce the area of a memory cell as compared with the conventional configuration. Specifically, in the conventional configuration, as for the size of the transistor that is gate width W/gate length L, the size ratio as compared is such that W(PT1)/L(PT1):W(NT3)/L(NT3):W(NT1)/L(NT1)=1:1:3 (the characters within parentheses indicate transistors). Therefore, the driver transistor of N-channel MOS transistor conventionally needs to be designed to be extremely large. However, in the present configuration, the size ratio may be designed such that W(PT1)/L(PT1):W(NT3)/L(NT3):W(NT1)/L(NT1)=1:1:1, and the area of the memory cell can be dramatically reduced as compared with the conventional. It is noted that the sizes of the other corresponding transistors are set similarly. Specifically, W(PT1)/L(PT1)=W(PT2)/L(PT2), W(NT3)/L(NT3)=W(NT5)/L(NT5)=W(NT4)/L(NT4)=W(NT6)/L(NT6), W(NT1)/L(NT1)=W(NT2)/L(NT2).

Moreover, as the transistor size is reduced, the leak current during standby can be reduced.

Second Embodiment

Figure 7:
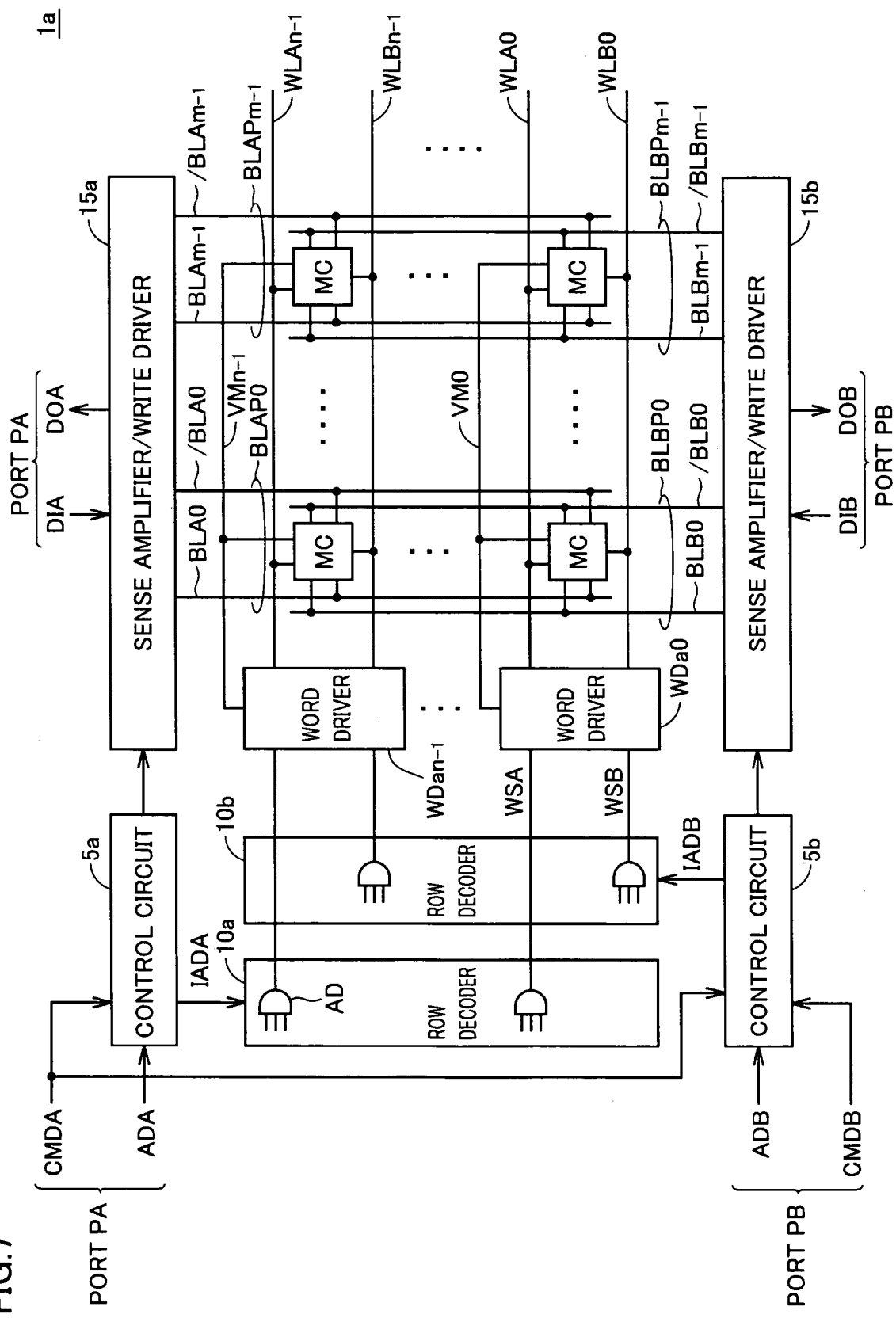
FIG. 7 is a schematic block diagram of a semiconductor memory device in accordance with a second embodiment of the present invention.

Referring to FIG. 7, a semiconductor memory device 1a in accordance with a second embodiment of the present invention differs in that word driver WD is replaced with a word driver WDa. In addition, it differs in that power supply lines VM0 to VMn−1 are provided respectively corresponding to memory cell rows. As for the other points, semiconductor memory device 1a is similar to semiconductor memory device 1 as shown in FIG. 1 in accordance with the first embodiment and therefore the detailed description will not be repeated.

Figure 8:
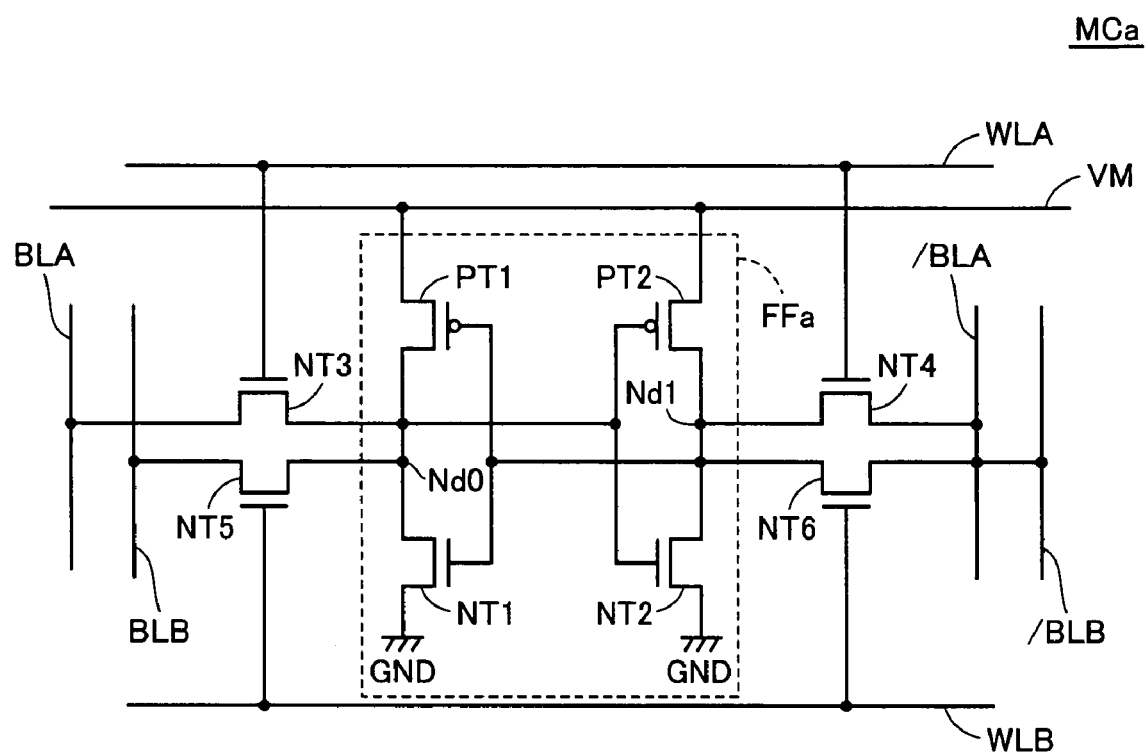
FIG. 8 is a circuit configuration diagram of a memory cell in accordance with the second embodiment of the present invention.

Referring to FIG. 8, a memory cell MCa in accordance with the second embodiment of the present invention differs from memory cell MC as described with reference to FIG. 2 in that the source sides of transistors PT1, PT2 are not connected to power supply voltage VDD but are connected to power supply line VM. The remaining configuration and connection relation are as described with reference to FIG. 2 and therefore the detailed description will not be repeated.

Memory cell MCa in accordance with the second embodiment of the present invention is configured such that an operating voltage is supplied from power supply line VM to a flip-flop circuit FFa of the memory cell.

Figure 9:
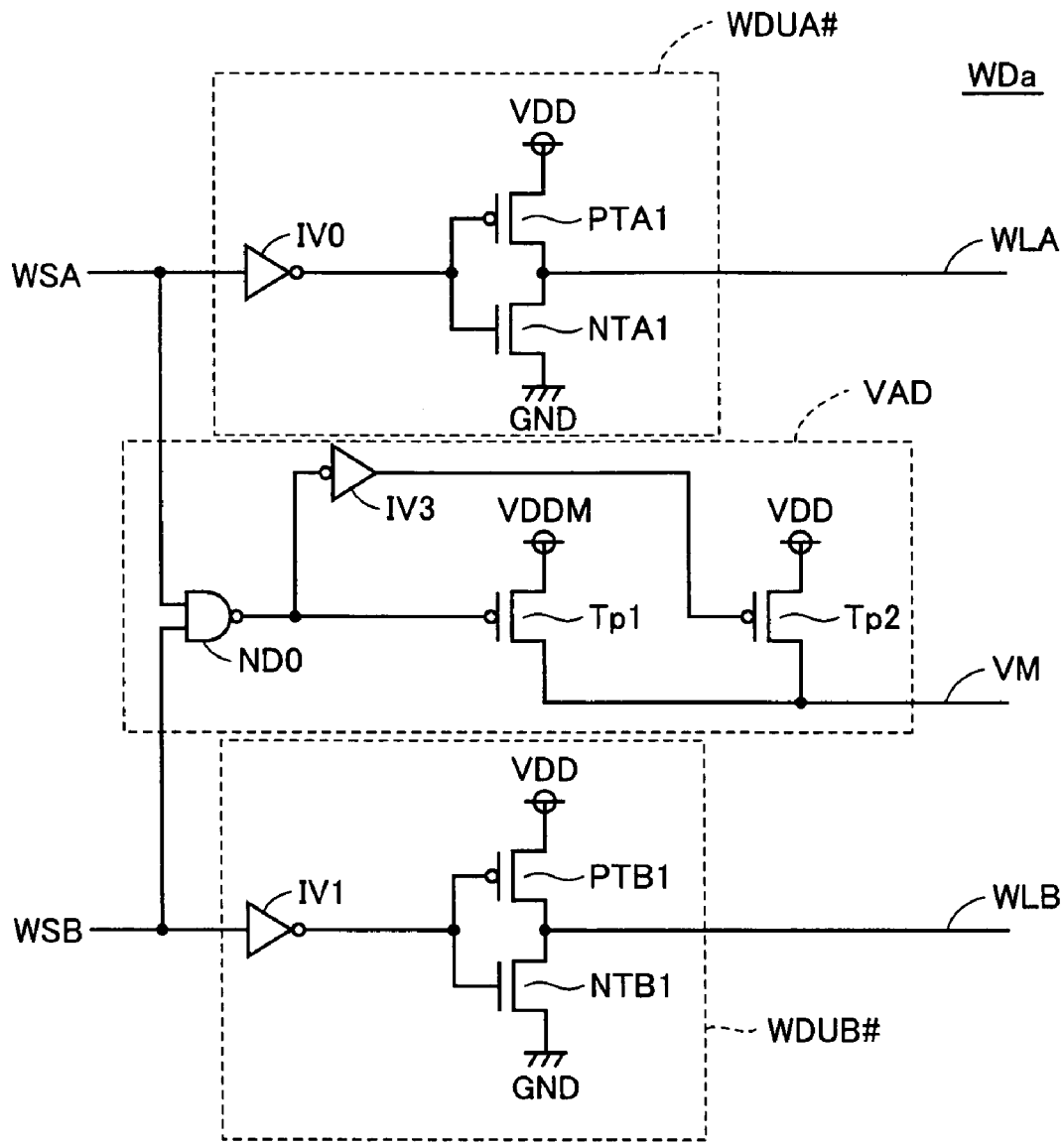
FIG. 9 is a circuit configuration diagram of a word driver in accordance with the second embodiment of the present invention.

Referring to FIG. 9, a word driver WDa in accordance with the second embodiment of the present invention includes transistors PTA1, NTA1, transistors PTB1, NTB1, transistors Tp1, Tp2, inverters IV0, IV1, IV3, and an NAND circuit ND0. It is noted that transistors Tp1 and Tp2 are P-channel MOS transistors.

Transistors PTA1, NTA1 are connected in series between a power supply voltage VDD and a ground voltage GND and have their connection node electrically coupled to a word line WLA. Their respective gates receive inputs of an inversion signal of a decode signal WSA through inverter IV0. Inverter IV0 and transistors PTA1, NTA1 constitute a word driver unit WDUA# for driving word line WLA.

Similarly, transistors PTB1, NTB1 are connected in series between power supply voltage VDD and ground voltage GND and have their connection node electrically coupled to a word line WLB. Their respective gates receive inputs of an inversion signal of a decode signal WSB through inverter IV1. Inverter IV1 and transistors PTB1, NTB1 constitute a word driver unit WDUB# for driving word line WLB.

NAND circuit ND0 receives the inputs of decode signals WSA and WSB to output its NAND logic operation result. Transistor Tp1 is arranged between power supply line VM and a power supply voltage VDDM higher than power supply voltage VDD and receives at its gate an input of an output signal of NAND circuit ND0. Transistor Tp2 is arranged between power supply voltage VDD and power supply line VM and receives at its gate an input of an inversion signal of NAND circuit ND0 through inverter IV3. NAND circuit ND0, inverter IV3, and transistors Tp1, Tp2 constitute a voltage switching circuit for switching a voltage level of power supply line VM.

An operation of word driver WDa in accordance with the second embodiment of the present invention will be described. For example, when row addresses different from each other are selected, when decode signal WSA is at "H" level and decode signal WSB is at "L" level, by way of example, word driver unit WDUA# drives word line WLA with power supply voltage VDD. Similarly, when decode signal WSA is at "L" level and decode signal WSB is at "H" level, word driver unit WDUB# drives word line WLB with power supply voltage VDD. The inversion signal through inverter IV0 is input to the gate of transistor PTA1, and word line WLA is electrically coupled to power supply voltage VDD and set to "H" level. In these cases, in a voltage adjusting circuit VAD, the output signal of NAND circuit ND0 is at "H" level. Therefore, transistor Tp1 is kept off and transistor Tp2 is kept on. Thus, power supply line VM is provided with power supply voltage VDD.

On the other hand, when the same row is accessed, decode signals WSA, WSB are both set to "H" level, and word lines WLA and WLB are driven with power supply voltage VDD. The output signal of NAND circuit ND0 is set to "L" level. Accordingly, transistor Tp1 turns on and transistor Tp2 turns off. Therefore, power supply line VM is provided with power supply voltage VDDM higher than power supply voltage VDD.

Figure 10:
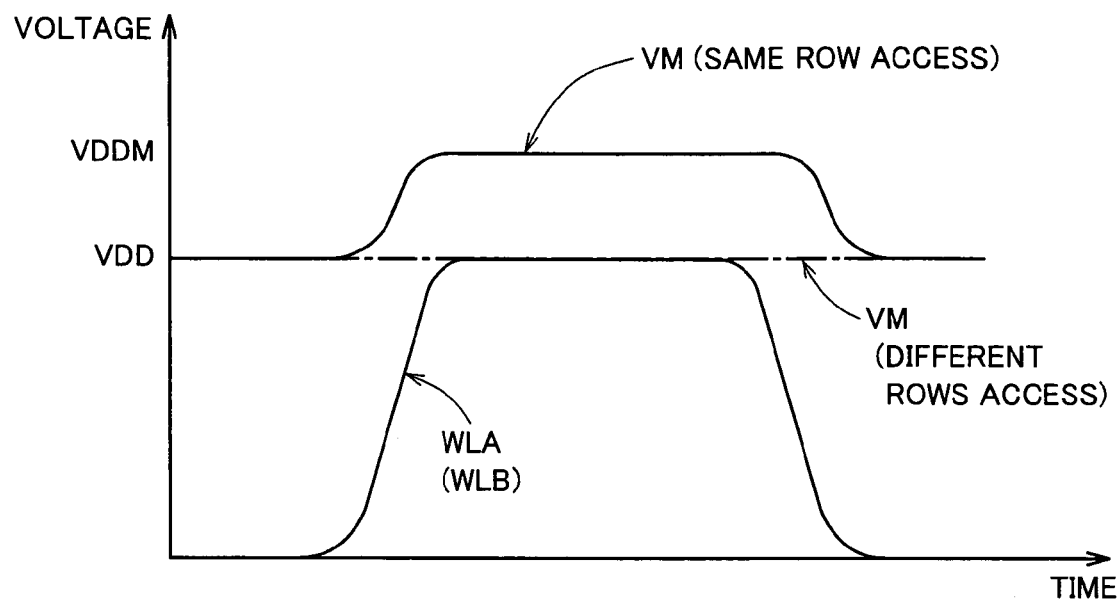
FIG. 10 is a diagram illustrating the relation between a power supply line and a word line in the same row access and in different rows access in accordance the second embodiment of the present invention.

Referring to FIG. 10, the relation between power supply line VM and word lines WLA, WLB in the same row access and the different rows access will be described.

Figure 11:
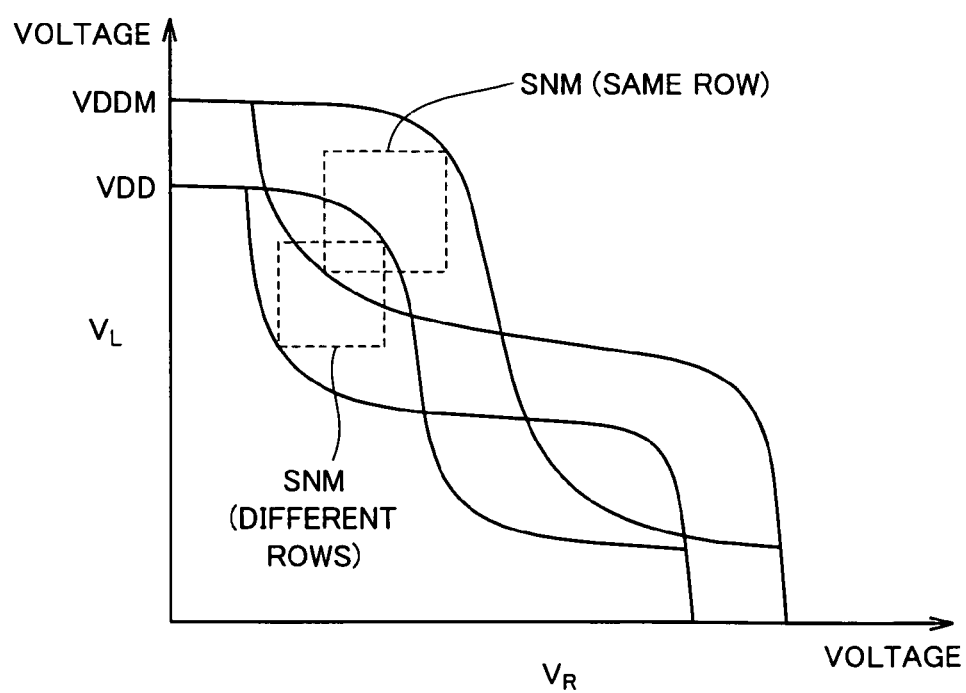
FIG. 11 is a diagram illustrating a static noise margin in accordance with the second embodiment of the present invention.

As shown in FIG. 10, in the same row access, the voltage level of power supply line VM rises from power supply voltage VDD to power supply voltage VDDM having the voltage level higher than power supply voltage VDD. Thus, the operating voltage of flip-flop FFa is set to power supply voltage VDD in the different rows access but is set to power supply voltage VDDM in the same row access. Therefore, as shown in the figure illustrating the static noise margin in accordance with the second embodiment of the present invention in FIG. 11, SNM can be kept approximately the same in the different rows access and in the same row access.

In this manner, when a row address of the same row is selected, the operating voltage of a flip-flop circuit of a memory cell is increased, thereby preventing deterioration of SNM in the same row access, similarly to the first embodiment.

Third Embodiment

Figure 12:
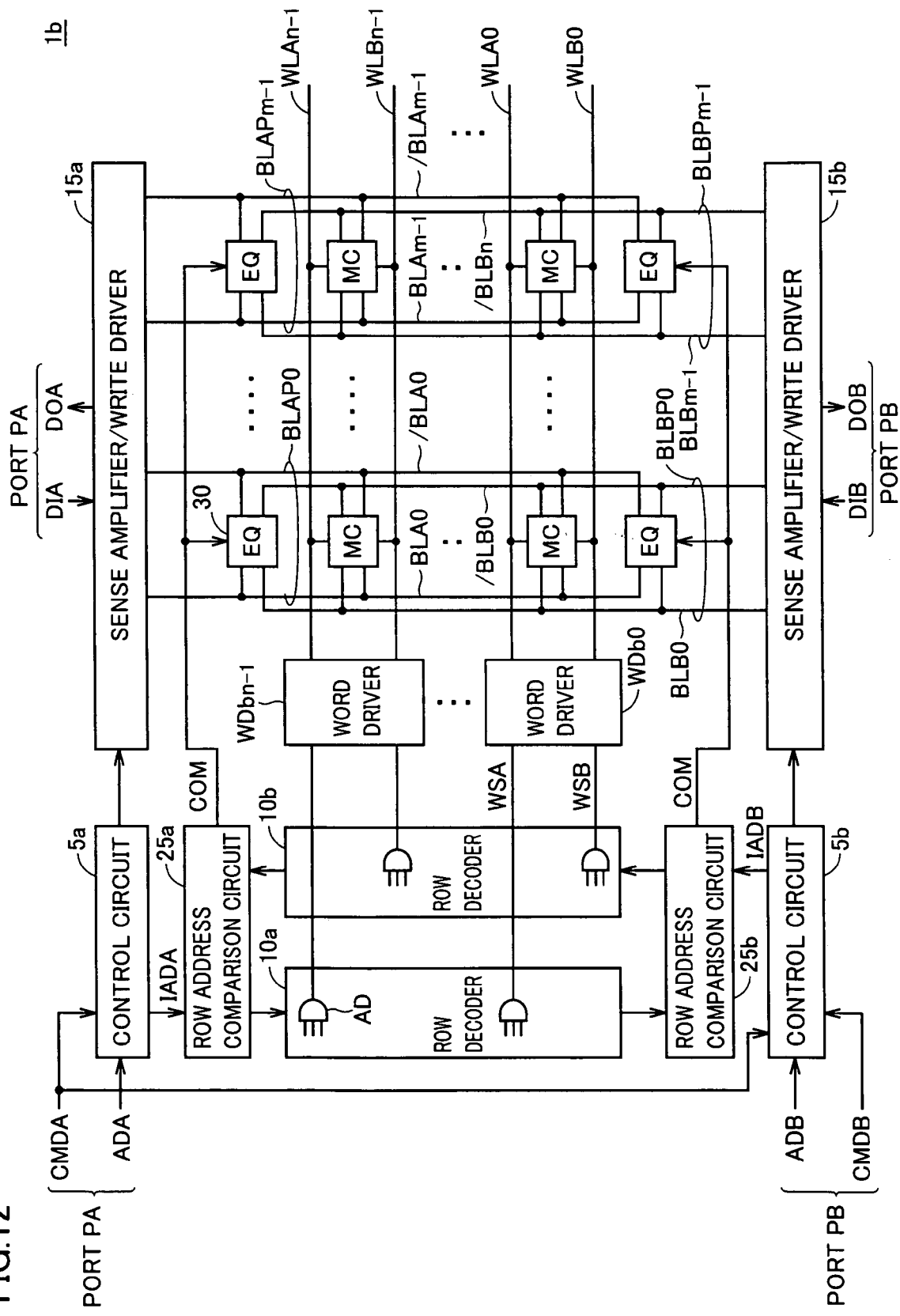
FIG. 12 is a schematic block diagram of a semiconductor memory device in accordance with a third embodiment of the present invention.

Referring to FIG. 12, a semiconductor memory device 1*b* in accordance with a third embodiment of the present invention differs from semiconductor memory device 1 as described with reference to FIG. 1 in that it further includes a row address comparison circuit 25*a* for port PA, a row address comparison circuit 25*b* for port PB, and an equalizer circuit 30 for short-circuiting bit line pairs BLAP and BLBP. In addition, it differs in that word driver WD is replaced with a word driver WDb. As for the other points, semiconductor memory device 1*b* is similar to semiconductor memory device 1 as shown in FIG. 1 in accordance with the first embodiment and therefore the detailed description will not be repeated.

Figure 13:
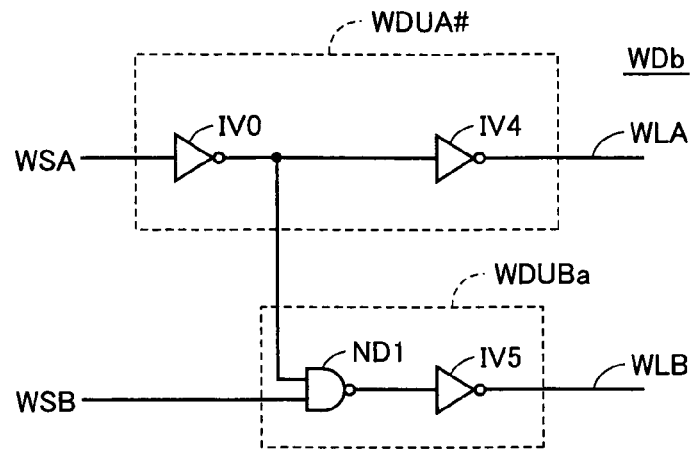
FIG. 13 is a circuit configuration diagram of a word driver in accordance with the third embodiment of the present invention.

Referring to FIG. 13, word driver WDb in accordance with the third embodiment of the present invention includes inverters IV0, IV4, IV5 and an NAND circuit ND1. Inverters IV0, IV4 constitute a word driver unit WDUA# for driving a word line WLA. On the other hand, NAND circuit ND1 and inverter IV5 constitute a word driver unit WDUBa for driving a word line WLB.

In word driver unit WDUA#, inverters IV0, IV4 are connected in series and receive an input of a decode signal WSA to drive word line WLA with a voltage level corresponding to the input. On the other hand, in word driver unit WDUBa, word line WLB is driven according to an output signal of an inversion signal of NAND circuit ND1 through inverter IV5.

Specifically, NAND circuit ND1 receives inputs of an inversion signal of a decode signal WSA through inverter IV0 and a decode signal WSB to output its NAND logic operation result to inverter IV5.

Therefore, when the same row access is executed, that is, when decode signals WSA, WSB are both at "H" level, the output signal of NAND circuit ND1 is at "H" level, and therefore word line WLB is not in an activated state. Thus, in this case, only word line WLA is in an activated state. In other words, word driver WDb in accordance with the third embodiment selects word line WLA only for port PA when the same row is selected.

Figure 14:
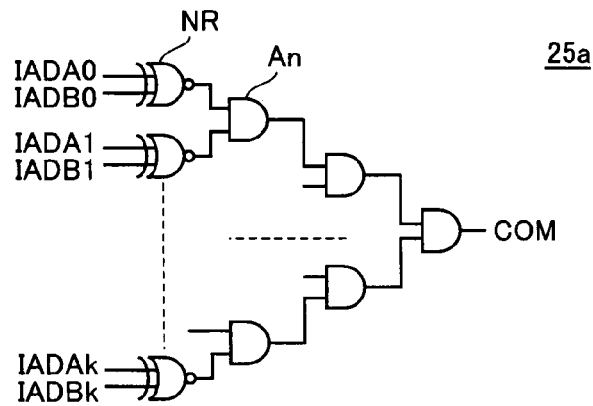
FIG. 14 is a circuit configuration diagram of a row address comparison circuit in accordance with the third embodiment of the present invention.

As shown in FIG. 14, row address comparison circuit 25*a* in accordance with the third embodiment of the present invention is configured with exclusive OR circuits NR (in this example, EXNOR circuits by way of example) at the first stage, followed by AND circuits An at a plurality of stages. Specifically, exclusive OR circuit NR receives respective bits of internal row address signals IADA, IADB for comparison. Then, in exclusive OR circuit NR, when the same internal row address signals IADA, IADB are input, a signal of "H" level is transmitted to the input nodes of the AND circuits at the following stages. If all have the same bit value, a control signal COM that is the output signal of the AND circuit at the final stage is set to "H" level. It is noted that a similar operation is carried out also in row address comparison circuit 25*b*.

Figure 15:
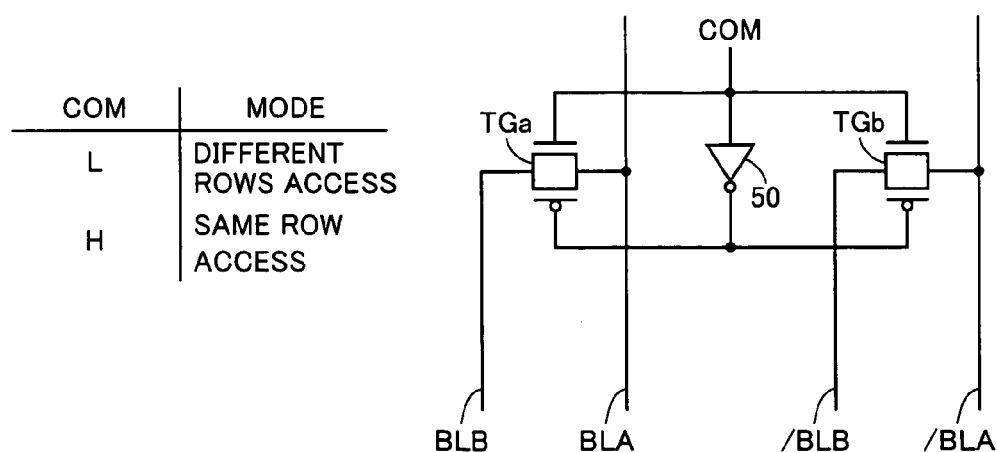
FIG. 15 is a circuit configuration diagram of an equalizer circuit in accordance with the third embodiment of the present invention.

Referring to FIG. 15, equalizer circuit 30 in accordance with the third embodiment of the present invention includes transfer gates TGa, TGb and an inverter 50.

Transfer gate TGa is arranged between bit lines BLA and BLB and receives at its gate inputs of control signal COM and an inversion signal through inverter 50. Transfer gate TGb is arrange between bit lines /BLB and /BLA and receives at its gate inputs of control signal COM and an inversion signal through inverter 50. More specifically, when control signal COM is at "L" level, the transfer gate is kept off, and when control signal COM is at "H" level, bit line BLA and bit line BLB are electrically coupled to each other. Similarly, bit lines /BLB and /BLA are electrically coupled to each other.

In the third embodiment of the present invention, internal row address IADA for port PA and internal row address IADB for port PB as input at row address comparison circuits 25*a*, 25*b* are compared with each other, and if they are matched, control signal COM is set to "H" level so that bit line pairs BLAP and BLBP are electrically coupled to each other. Accordingly, as described above, in word driver WDb, when the row address of the same row is selected, even if only word line WLA for port PA is activated, bit line pairs BLAP and BLBP may be used to perform the similar operations in a sense amplifier/write driver 15*a* for port PA and a sense amplifier/write driver 15*b* for port PB. For example, in data reading, read data DOA, DOB can be output respectively.

Figure 16A:
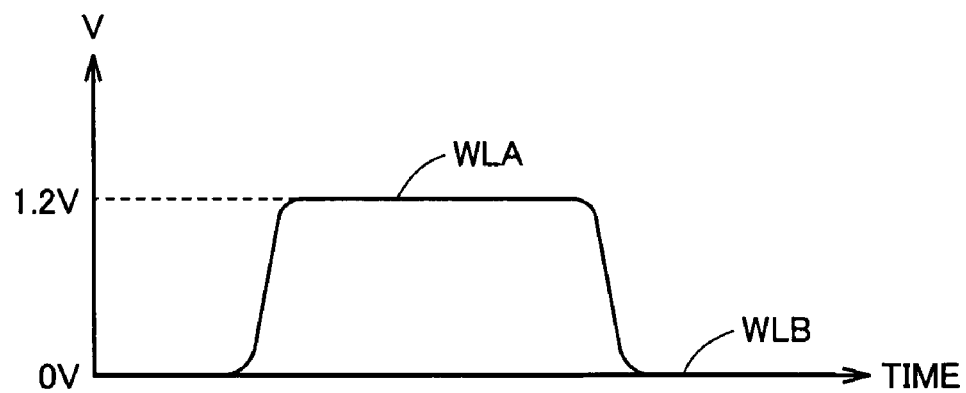
FIGS. 16A-16C are operation waveform diagrams of a word line and a bit line pair in different rows access in accordance with the third embodiment of the present invention.
Figure 16B:
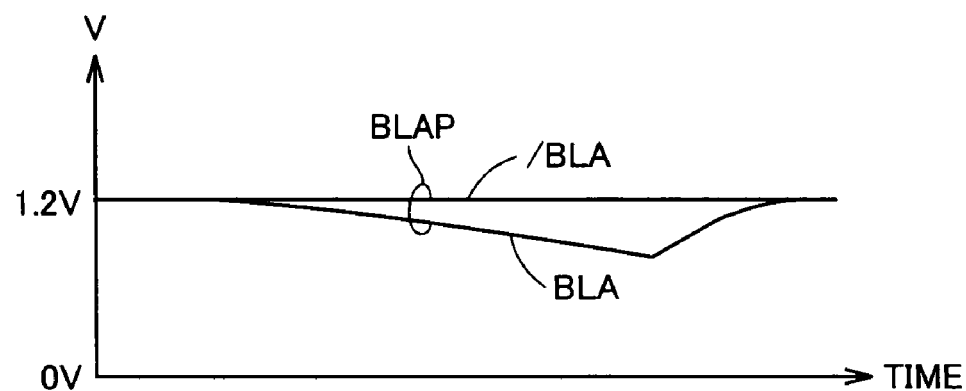
Figure 16C:
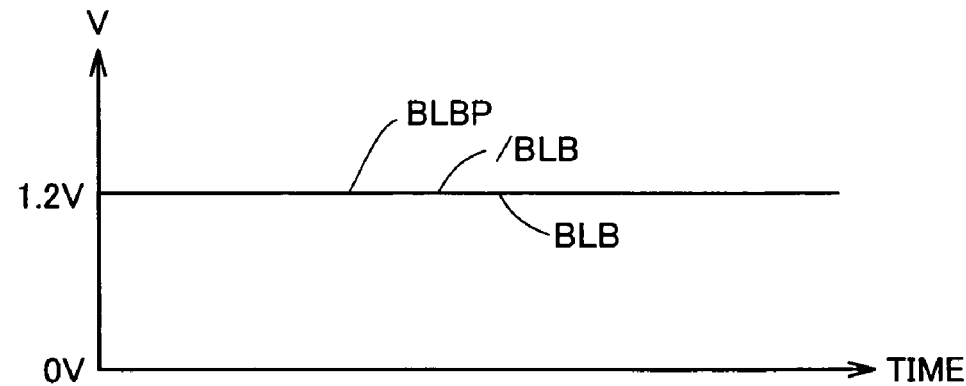

Referring to FIGS. 16A to 16C, the operation waveforms of word lines WLA, WLB and bit line pairs BLAP, BLBP in the different rows access in accordance with the third embodiment of the present invention will be described. In this example, it is assumed that decode signals WSA, WSB are at "H" level and "L" level, respectively, by way of example.

As shown in FIG. 16A, word line WLA is driven with a voltage of 1.2V as described above. On the other hand, word line WLB is in an inactivated state and set at 0V.

As shown in FIG. 16B, bit line pair BLAP changes from a potential level of 1.2V as precharged according to a potential level of storage nodes Nd0, Nd1 of a memory cell selected in accordance with an address. Here, it is shown that storage nodes Nd0, Nd1 are set at potential levels of "L" level and "H" level. Therefore, as transistors NT3, NT4 turn on, the potential level of bit lines BLA, /BLA changes, which is amplified by sense amplifier/write driver 15a to be externally output as read data DOA.

FIG. 16C illustrates the potential level of bit line pair BLBP, where the precharged potential level of 1.2V is kept as word line WLB is in an inactivated state.

Figure 17A:
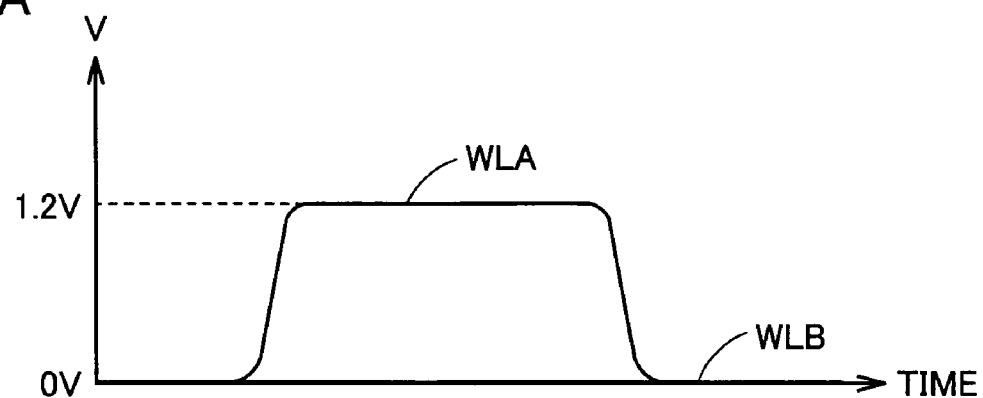
FIGS. 17A-17C are operation waveform diagrams of a word line and a bit line pair in the same row access in accordance with the third embodiment of the present invention.
Figure 17B:
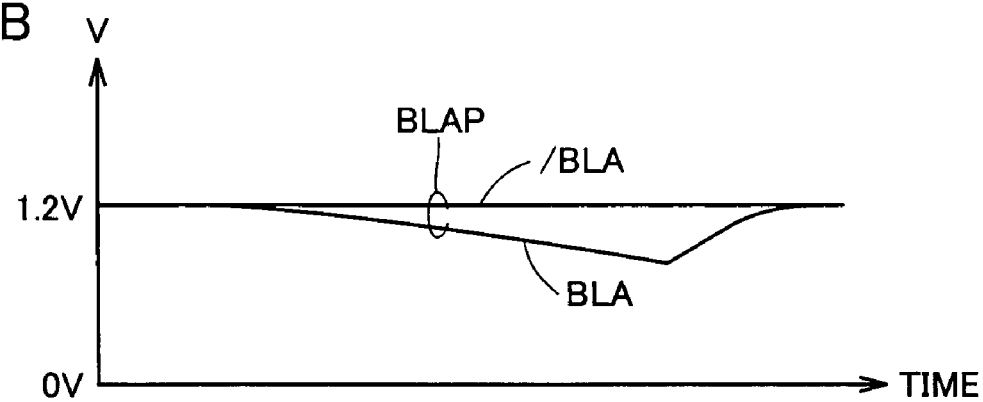
Figure 17C:
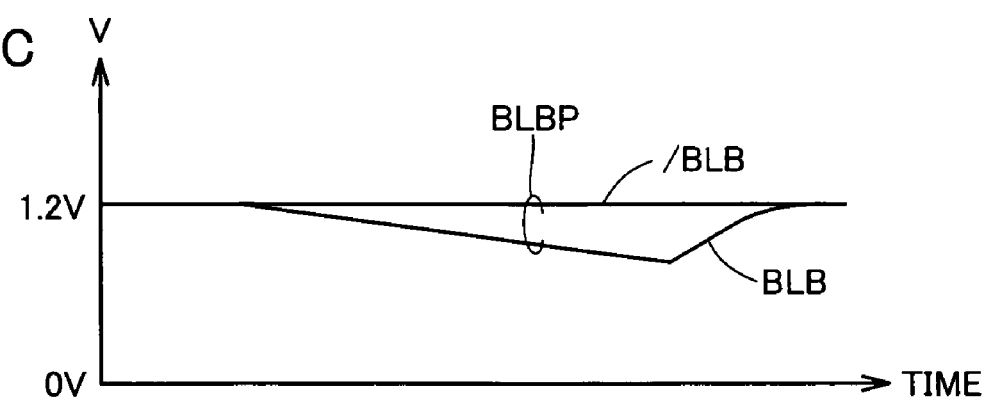

Referring to FIGS. 17A to 17C, the operation waveforms of word lines WLA, WLB and bit line pairs BLAP, BLBP in the same row access in accordance with the third embodiment of the present invention will be described As shown in FIG. 17A, in the same row access, only word line WLA is activated. Therefore, the state is the same as described with reference to FIG. 16A.

As shown in FIG. 17B, bit line pair BLAP has its potential level changed by the similar operation as described with reference to FIG. 16B.

FIG. 17C shows the potential level of bit line pair BLBP. In the same row access, as described above, in response to control signal COM, equalizer circuit 30 short-circuits bit line BLA and bit line BLB. Similarly, bit line /BLA and bit line /BLB are short-circuited. Accordingly, in response to the operation of equalizer circuit 30, bit line pair BLBP attains the potential level similar to that of bit line pair BLAP.

This is detected by sense amplifier/write drivers 15a, 15b for ports PA and PB, so that read data DOA, DOB can be externally output.

In this way, when the row address of the same row is selected, only word line WLA is activated. Thus, the operation such as data reading can be performed appropriately using both ports while deterioration of SNM is prevented.

Fourth Embodiment

In the third embodiment described above, when the row address of the same row is selected, only word line WLA is driven without driving word line WLB, and bit line pair BLAP and bit line pair BLBP are short-circuited using equalizer circuit 30, so that a prescribed operation is performed appropriately using both ports PA and PB. In the fourth embodiment, when the row address of the same row is selected, a prescribed operation is performed appropriately using both ports PA and PB without using equalizer circuit 30.

Figure 18:
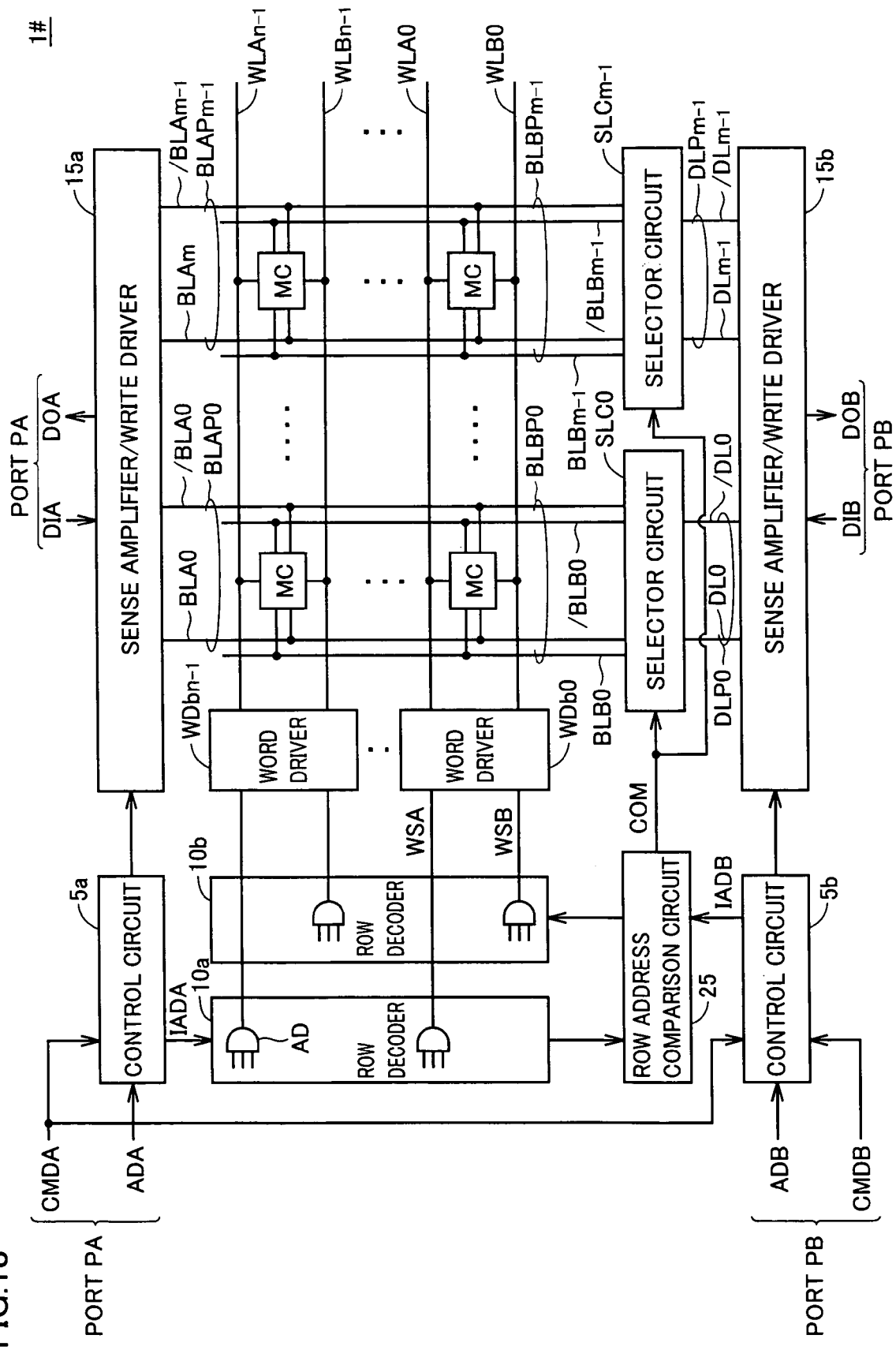
FIG. 18 is a schematic block diagram of a semiconductor memory device in accordance with a fourth embodiment of the present invention.

Referring to FIG. 18, a semiconductor memory device 1# in accordance with the fourth embodiment of the present invention differs from semiconductor memory device 1b as described with reference to FIG. 12 in that one row address comparison circuit 25 is provided and in addition data line pairs DLP and selector circuits SLC are provided respectively corresponding to memory cell columns. As for the other points, semiconductor memory device 1# is similar to semiconductor memory device 1 as shown in FIG. 1 and therefore the detailed description will not be repeated. It is noted that data line pair DLP includes data lines DL, /DL. In this example, a data line pair DLP0 and a data line pair DLPm−1 are shown.

Row address comparison circuit 25 is similar to the row address comparison circuit illustrated in FIG. 14 and therefore the detailed description will not be repeated. Specifically, an internal row address IADA input for port PA is compared with an internal row address IADB input for port PB, and if the row addresses are matched, control signal COM goes to "H" level. In other cases, control signal COM is set to "L" level.

Figure 19:
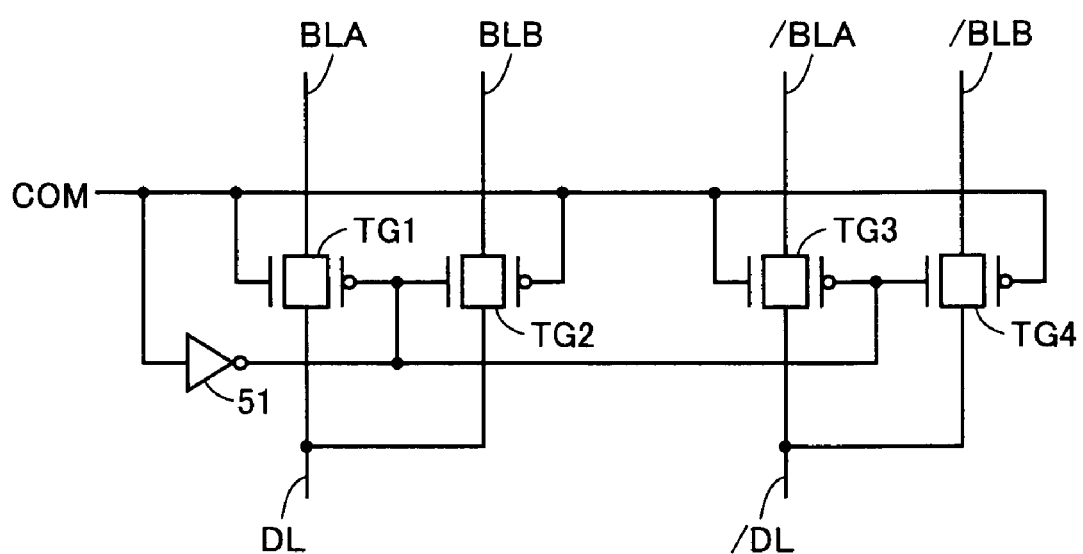
FIG. 19 is a circuit configuration diagram of a selector circuit in accordance with the fourth embodiment of the present invention.

Referring to FIG. 19, selector circuit SLC in accordance with the fourth embodiment of the present invention includes transfer gates TG1 to TG4 and an inverter 51.

Transfer gates TG1, TG2 are connected in parallel between bit lines BLA, BLB and a data line DL, respectively. Transfer gates TG3, TG4 are connected in parallel between bit lines /BLA, /BLB and a data line /DL, respectively.

Transfer gates TG1, TG2 receive inputs of control signal COM and an inversion signal through inverter 51. Transfer gates TG3, TG4 also operate similarly to transfer gates TG1, TG2. In other words, in selector circuit SLC in accordance with the fourth embodiment of the present invention, the connection with data line DL switches from bit line pair BLAP to bit line pair BLBP according to the input of control signal COM.

Therefore, when control signal COM is at "L" level, similarly to the normal operation, bit line pair BLBP for port PB is electrically connected to sense amplifier/write driver 15b through data line pair DLP. On the other hand, when control signal COM is at "H" level, bit line pair BLAP for port PA is electrically connected to sense amplifier/write driver 15b through data line pair DLP.

In the configuration in accordance with the fourth embodiment, as described in the third embodiment, when the row address of the same row is accessed, only word line WLA is driven and word line WLB is not driven. Then, control signal COM changes from "L" level to "H" level, and selector circuit SLC switches the connection of sense amplifier/write driver 15b from bit line pair BLBP to BLAP.

Accordingly, when the row address of the same row is accessed, both of sense amplifier/write drivers 15a, 15b perform prescribed operations using the same bit line pair BLAP. More specifically, in this case, bit line pair BLAP for port PA is connected to both sense amplifier/write drivers 15a and 15b through selector circuit SLC, so that access is carried out from each port.

Because of the configuration in accordance with the fourth embodiment, as described in the third embodiment, SNM can be secured enough, and in addition the size of a driver transistor of a memory cell can be reduced. Thus, the cell area can be decreased. Moreover, leak can be reduced during standby.

Furthermore, as compared with the third embodiment, it is advantageous that a reading operation speed is not decreased since a sense operation is performed in data reading only using bit line pair BLAP for port PA, and that a power consumption of charging/discharging in data reading can be reduced.

Figure 20:
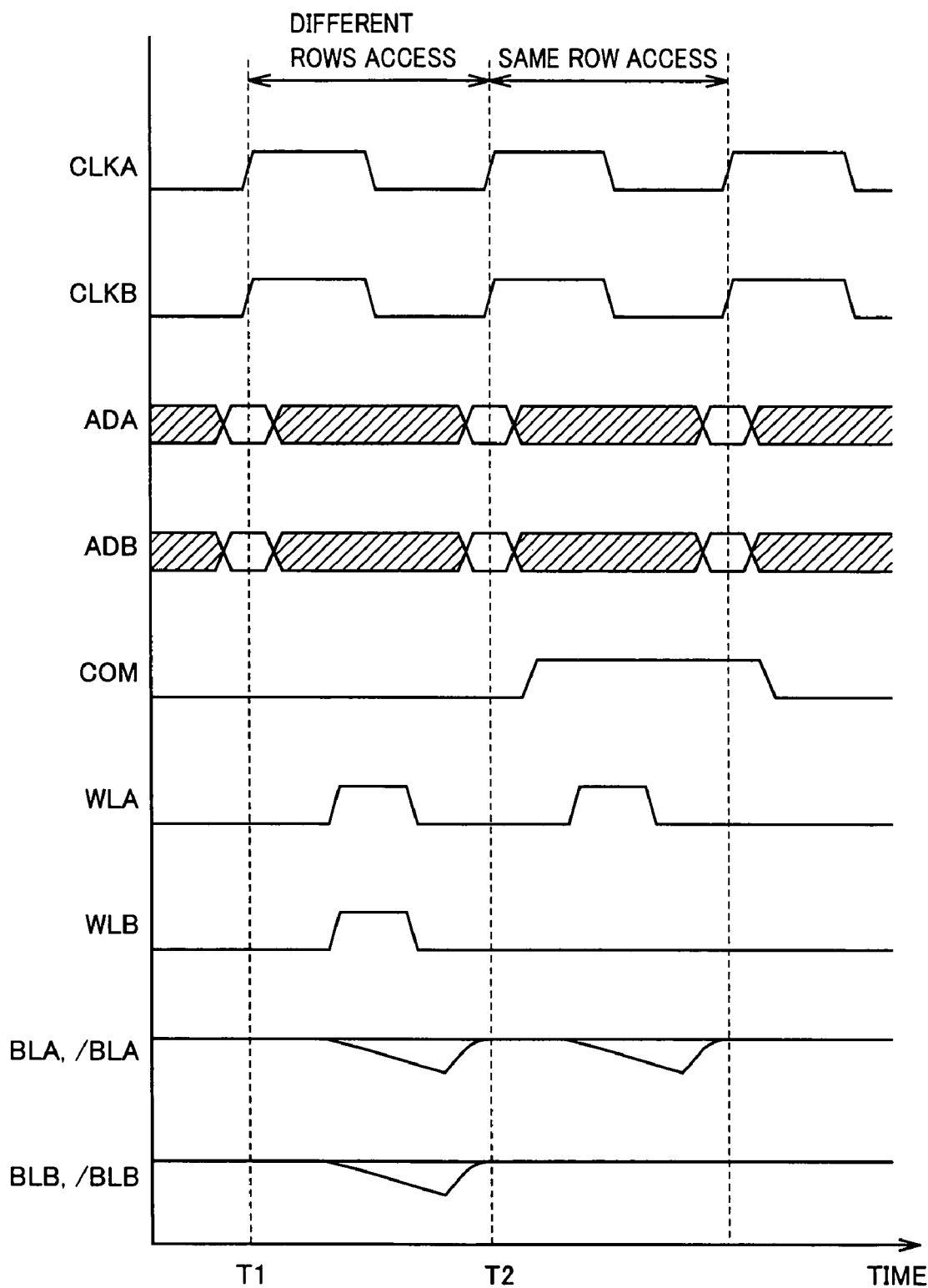
FIG. 20 is a timing chart where the same row access and different rows access are executed in synchronization with clock signals.

Referring to FIG. 20, execution of the same row access and different rows access in synchronization with clock signals CLKA, CLKB will be described.

FIG. 20 shows the waveform diagram showing clock CLKA for port PA and clock CLKB for port PB, which are of the same frequency and are synchronized together at the same timing.

For example, at a time T1, in the different rows access, according to the input addresses ADA, ADB for port PA and for port PB, respective different word lines WLA, WLB are selected, so that a data reading operation according to the input address is carried out.

On the other hand, at a time T2, in the same row access, based on a comparison result between the input addresses ADA and ADB, control signal COM is set to "H" level. Therefore, only word line WLA is activated and word line WLB is in an inactivated state. Then, bit line pair BLAP is used as a bit line for a data reading operation, so that dual-port high speed data reading can be carried out without deterioration of SNM.

Referring to FIG. 21, another execution of the same row access and different rows access in synchronization with clock signals CLKA, CLKB will be described. In this example, clock signals CLKA, CLKB are different in frequency. In FIG. 20, clock signals CLKA and CLKB have the same frequency. Without being limited to the same, the frequency of clock signal CLKA may be set a few times as high as the frequency of clock signal CLKB.

In operation, as described with reference to FIG. 20, at a time T3, different rows access is carried out using ports PA, PB. The operation is similar as described above and therefore the detailed description will not be repeated. At a time T4, access only from port PA is shown. At a time T5, different rows access is carried out using ports PA, PB. The operation is similar as described above and therefore the detailed description will not be repeated. At a time T6, access only from port PA is shown.

It is noted that in the embodiments above a semiconductor memory device having a dual-port as a kind of multiport is mainly described. The present invention, however, is not limited thereto and is applicable similarly to a semiconductor memory device having even more ports.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory array having a plurality of memory cells arranged in rows and columns;
   first and second ports receiving and transmitting input/output signals independent of each other; and
   a selection circuit capable of simultaneously accessing said memory array according to addresses respectively input to said first and second ports,
   said memory array including
   a plurality of first and second word lines provided respectively corresponding to memory cell rows, and
   a plurality of first and second bit lines provided respectively corresponding to memory cell columns,
   each of said memory cells including
   a flip-flop circuit for setting first and second storage nodes to one and the other of first and second potential levels, respectively, according to data to be stored,
   a first gate transistor having its gate electrically coupled to a corresponding first word line for electrically coupling a corresponding first bit line to said flip-flop circuit, and
   a second gate transistor having its gate electrically coupled to a corresponding second word line for electrically coupling a corresponding second bit line to said flip-flop circuit,
   said selection circuit including
   first and second row decoders provided respectively corresponding to said first and second ports for outputting respective row selection instructions according to input addresses, and
   a plurality of word drivers provided respectively corresponding to memory cell rows, each for driving corresponding first and second word lines according to row selection results from said first and second row decoders, wherein
   when receiving an input of a row selection instruction from one of said first and second row decoders, each of said word drivers sets a voltage level of a word line corresponding to the one to a first voltage level, and when receiving inputs of row selection instructions from both of said first and second row decoders, each of said word drivers sets respective voltage levels of first and second word lines to a second voltage level lower than said first voltage level.

2. The semiconductor memory device according to claim 1, wherein each of said word drivers includes
   first and second word driver units provided respectively corresponding to corresponding first and second word lines for setting a voltage level of said corresponding first and second word lines to either one of first and second voltage levels in response to row selection instructions respectively input from said first and second row decoders, and
   a detection circuit detecting inputs of row selection instructions from both of said first and second row decoders to instruct said first and second word driver units to set a voltage level of said corresponding first and second word lines to the second voltage level.

* * * * *